(12) United States Patent
Bakeman et al.

(10) Patent No.: US 10,801,975 B2
(45) Date of Patent: Oct. 13, 2020

(54) METROLOGY TOOL WITH COMBINED X-RAY AND OPTICAL SCATTEROMETERS

(71) Applicant: KLA-Tencor Corporation, Milpitas, CA (US)

(72) Inventors: Michael S. Bakeman, San Jose, CA (US); Andrei V. Shchegrov, Campbell, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 2131 days.

(21) Appl. No.: 13/887,343

(22) Filed: May 5, 2013

(65) Prior Publication Data

US 2013/0304424 A1  Nov. 14, 2013

Related U.S. Application Data

(60) Provisional application No. 61/669,901, filed on Jul. 10, 2012, provisional application No. 61/644,050, filed on May 8, 2012.

(51) Int. Cl.
*G01N 23/201* (2018.01)
*G01N 21/84* (2006.01)
(Continued)

(52) U.S. Cl.
CPC ........... *G01N 23/201* (2013.01); *G01N 21/84* (2013.01); *G03F 7/70625* (2013.01);
(Continued)

(58) Field of Classification Search
CPC .... G01N 23/04; G01N 23/223; H05G 21/005; H05G 1/64; B07C 5/3427; G01B 11/24
(Continued)

(56) References Cited

U.S. PATENT DOCUMENTS 4,063,092 A * 12/1977 Berdahl .................. H05G 1/64
378/108
5,325,414 A * 6/1994 Tanaka ................ G03F 7/70691
378/206

(Continued)

FOREIGN PATENT DOCUMENTS

JP         10221499 A        8/1998

OTHER PUBLICATIONS

Itoh "Study of the SIO2/Si interface using spectroscopic ellipsometry and x-ray reflectometry" (Year: 2002).*

(Continued)

*Primary Examiner* — Regis J Betsch
*Assistant Examiner* — Kaleria Knox
(74) *Attorney, Agent, or Firm* — Spano Law Group; Joseph S. Spano

(57) ABSTRACT

Methods and systems for performing simultaneous optical scattering and small angle x-ray scattering (SAXS) measurements over a desired inspection area of a specimen are presented. SAXS measurements combined with optical scatterometry measurements enables a high throughput metrology tool with increased measurement capabilities. The high energy nature of x-ray radiation penetrates optically opaque thin films, buried structures, high aspect ratio structures, and devices including many thin film layers. SAXS and optical scatterometry measurements of a particular location of a planar specimen are performed at a number of different out of plane orientations. This increases measurement sensitivity, reduces correlations among parameters, and improves measurement accuracy. In addition, specimen parameter values are resolved with greater accuracy by fitting data sets derived from both SAXS and optical scatterometry measurements based on models that share at least one geometric (Continued)

parameter. The fitting can be performed sequentially or in parallel.

20 Claims, 5 Drawing Sheets

(51) Int. Cl.
   *G03F 7/20* (2006.01)
   *G01N 21/956* (2006.01)
(52) U.S. Cl.
   CPC ...... *G03F 7/70633* (2013.01); *G01B 2210/56* (2013.01); *G01N 21/956* (2013.01)
(58) Field of Classification Search
   USPC ................. 378/57, 50, 108, 119, 45, 8, 206; 356/369; 250/307; 600/407
   See application file for complete search history.

(56) References Cited

U.S. PATENT DOCUMENTS

| | | | |
|---|---|---|---|
| 6,266,390 B1* | 7/2001 | Sommer, Jr. | B07C 5/3427 378/45 |
| 6,593,152 B2 | 7/2003 | Nakasuji et al. | |
| 6,633,831 B2 | 10/2003 | Nikoonahad et al. | |
| 6,734,967 B1 | 5/2004 | Piwonka-Corle et al. | |
| 6,816,570 B2 | 10/2004 | Janik et al. | |
| 6,895,075 B2 | 5/2005 | Yokhin et al. | |
| 6,912,438 B2 | 6/2005 | Choo et al. | |
| 6,956,928 B2 | 10/2005 | He et al. | |
| 6,972,852 B2 | 12/2005 | Opsal et al. | |
| 7,209,223 B1 | 4/2007 | Hull et al. | |
| 7,478,019 B2 | 1/2009 | Zangooie et al. | |
| 7,483,517 B2 | 1/2009 | Barschdorf et al. | |
| 7,826,071 B2 | 11/2010 | Shchegrov et al. | |
| 7,929,667 B1* | 4/2011 | Zhuang | H05G 2/005 378/119 |
| 7,974,379 B1* | 7/2011 | Case | G01N 23/046 378/206 |
| 2006/0103844 A1 | 5/2006 | Opsal | |
| 2006/0167651 A1 | 7/2006 | Zangooie et al. | |
| 2006/0290931 A1 | 12/2006 | Zhao et al. | |
| 2007/0238957 A1* | 10/2007 | Yared | A61B 5/0059 600/407 |
| 2008/0159475 A1* | 7/2008 | Mazor | G01N 23/223 378/50 |
| 2009/0010386 A1* | 1/2009 | Peschmann | G01N 23/223 378/57 |
| 2009/0238325 A1* | 9/2009 | Kargar | A61B 6/06 378/8 |
| 2009/0279090 A1* | 11/2009 | Wolf | G01B 11/24 356/369 |
| 2012/0025075 A1* | 2/2012 | Moore | G02B 21/002 250/307 |
| 2012/0057680 A1 | 3/2012 | Hemberg et al. | |

OTHER PUBLICATIONS

International Search Report and Written Opinion dated Sep. 17, 2013, for PCT Application No. PCT/US2013/039965 filed on May 7, 2013, by KLA-Tencor Corporation, 12 pages.
Chengqing Wang et al. , Linewidth Roughness and Cross-sectional Measurements of Sub-50 nm Structures Using CD-SAXS and CD-SEM,IEEE?SEMI Advanced, Semiconductor Manufacturing Conference, 2008, pp. 142-147. http://ieeexplore.ieee.org/stamp/stamp.jsp?tp=&arnumber=4529019.

* cited by examiner

METROLOGY TOOL WITH COMBINED X-RAY AND OPTICAL SCATTEROMETERS

CROSS REFERENCE TO RELATED APPLICATION

The present application for patent claims priority under 35 U.S.C. § 119 from U.S. provisional patent application Ser. No. 61/644,050, entitled "Scatterometry Metrology Apparatus With X-Ray And Optical Capabilities," filed May 8, 2012, and U.S. provisional patent application Ser. No. 61/669,901, entitled "Model Building And Analysis Engine For Measuring Structure And Film Parameters Using Optical And X-ray Metrology Technologies," filed Jul. 10, 2012. The subject matter of each U.S. provisional patent application is incorporated herein by reference in its entirety.

TECHNICAL FIELD

The described embodiments relate to metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition and other parameters of nanoscale structures.

Traditionally, scatterometry measurements are performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty. For example, modern memory structures are often high-aspect ratio, three-dimensional structures that make it difficult for optical radiation to penetrate to the bottom layers. In addition, the increasing number of parameters required to characterize complex structures (e.g., FinFETs), leads to increasing parameter correlation. As a result, the parameters characterizing the target often cannot be reliably decoupled with available measurements. In another example, opaque, high-k materials are increasingly employed in modern semiconductor structures. Optical radiation is often unable to penetrate layers constructed of these materials. As a result, measurements with thin-film scatterometry tools such as ellipsometers or reflectometers are becoming increasingly challenging.

In response to these challenges, more complex optical tools have been developed. For example, tools with multiple angles of illumination, shorter and broader ranges of illumination wavelengths, and more complete information acquisition from reflected signals (e.g., measuring multiple Mueller matrix elements in addition to the more conventional reflectivity or ellipsometric signals) have been developed. However, these approaches have not reliably overcome fundamental challenges associated with measurement of many advanced targets (e.g., complex 3D structures, structures smaller than 10 nm, structures employing opaque materials) and measurement applications (e.g., line edge roughness and line width roughness measurements).

In one example, grazing incidence small angle x-ray scattering (GISAXS) is combined with x-ray reflectometry (XRR) for surface layer characterization of thin films as presented in U.S. Pat. No. 6,895,075, entitled "X-Ray Reflectometry With Small-Angle Scattering Measurement," issued on May 17, 2005, and assigned to Jordan Valley Applied Radiation Ltd. These techniques are sensitive to surfaces, but not to buried structures or films below the surface. In addition, the spot sizes of the probe beams are greatly increased due to the shallow incidence angles employed in these techniques. Although large spot sizes can be mitigated using, for example, apertures or knife edges, this results in an undesirable reduction in flux and increase in measurement time.

Future metrology applications present challenges for metrology due to increasingly small resolution requirements, multi-parameter correlation, increasingly complex geometric structures, and increasing use of opaque materials. Thus, methods and systems for improved CD measurements are desired.

SUMMARY

Methods and systems for performing critical dimension measurements are presented. Such systems are employed to measure structural and material characteristics (e.g., material composition, dimensional characteristics of structures and films, etc.) associated with different semiconductor fabrication processes.

In one aspect, a single metrology tool performs simultaneous optical scattering and small angle x-ray scattering (SAXS) measurements over an inspection area of a specimen. SAXS measurements combined with optical scatterometry measurements enables a metrology tool with increased measurement capabilities due to the complementary nature of SAXS and optical scatterometry techniques. SAXS is capable of measuring geometric parameters (e.g., pitch, critical dimension (CD), side wall angle (SWA), line width roughness (LWR), and line edge roughness (LER)) of structures smaller than 10 nanometers. In addition, the high energy nature of x-ray radiation penetrates optically opaque thin films, buried structures, high aspect ratio structures, and devices including many thin film layers. Optical scatterometry techniques are capable of measuring pitch, CD, thin film thickness, composition, and dispersion of many different structures.

In another aspect, the precision and accuracy of parameters measured with combined SAXS and optical scatterometry techniques can be improved by identifying shared model parameters that can be mathematically resolved using data sets derived from SAXS and optical scatterometry measurements either sequentially or in parallel. Measuring shared parameters with a diversity of measurement technologies reduces correlations among parameters and improves measurement accuracy.

In yet another aspect, SAXS and optical scatterometry measurements performed on a planar specimen (e.g., semiconductor wafer) oriented at a number of different out of plane orientations increases the precision and accuracy of measured parameters. Measuring a location of the specimen at a number of different angles results in an enhanced data set corresponding to that location. Measuring parameters with a deeper, more diverse data set also reduces correlations among parameters and improves measurement accuracy.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings. Methods and systems for performing critical dimension measurements are presented. Such systems are employed to measure structural and material characteristics (e.g., material composition, dimensional characteristics of structures and films, etc.) associated with different semiconductor fabrication processes.

In one aspect, a combined metrology tool performs simultaneous optical scattering and small angle x-ray scattering (SAXS) measurements over an inspection area of a specimen. A metrology tool combining SAXS measurements and optical scatterometry measurements enables increased measurement sensitivity and throughput due to the complementary nature of SAXS and optical scatterometry techniques. By way of non-limiting example, SAXS is capable of measuring geometric parameters (e.g., pitch, critical dimension (CD), side wall angle (SWA), line width roughness (LWR), and line edge roughness (LER)) of structures smaller than 10 nanometers. In addition, the high energy nature of x-ray radiation penetrates optically opaque thin films, buried structures, high aspect ratio structures, and devices including many thin film layers. By way of non-limiting example, optical scatterometry techniques are capable of measuring pitch, CD, thin film thickness, composition, and dispersion of many different structures.

SAXS and optical scatterometry applied in combination as described herein may be used to determine characteristics of semiconductor structures. Exemplary structures include, but are not limited to, FinFETs, low-dimensional structures such as nanowires or graphene, sub 10 nm structures, thin films, lithographic structures, through silicon vias (TSVs), memory structures such as DRAM, DRAM 4F2, FLASH and high aspect ratio memory structures. Exemplary structural characteristics include, but are not limited to, geometric parameters such as line edge roughness, line width roughness, pore size, pore density, side wall angle, profile, film thickness, critical dimension, pitch, and material parameters such as electron density, crystalline grain structure, morphology, orientation, stress, and strain.

Figure 1:
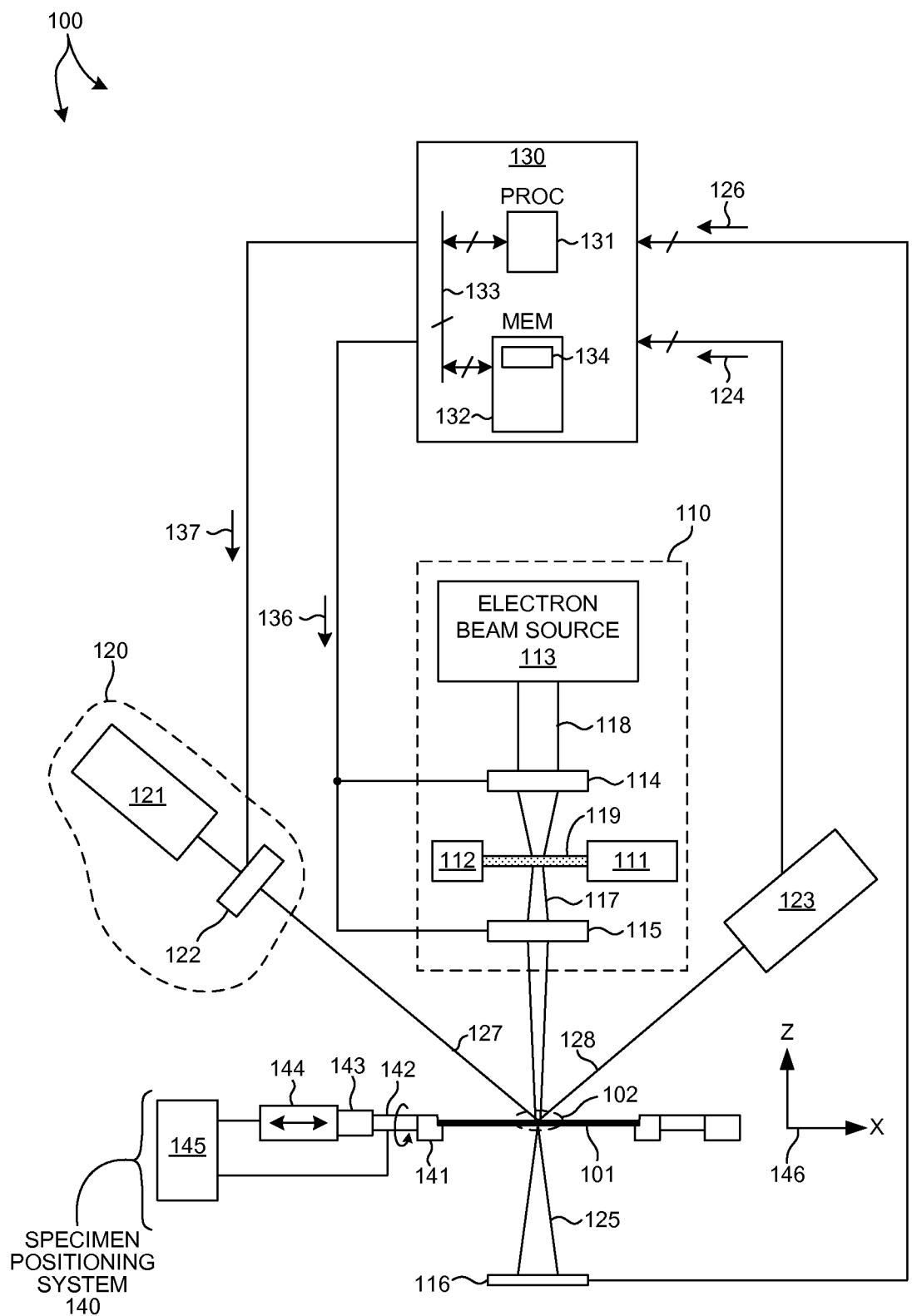
FIG. 1 is a diagram illustrative of a combined metrology system 100 configured to combine x-ray and optical metrologies in accordance with the methods described herein.

FIG. 1 illustrates a combined metrology tool 100 for measuring characteristics of a specimen in accordance with the exemplary methods presented herein. As shown in FIG. 1, the system 100 may be used to perform simultaneous optical scatterometry measurements and SAXS measurements over an inspection area 102 of a specimen 101 disposed on a specimen positioning system 140. In some embodiments, the inspection area 102 has a spot size of fifty micrometers or less.

In the depicted embodiment, metrology tool 100 includes a liquid metal based x-ray illumination system 110 and an x-ray detector 116. X-ray illumination system 110 includes a high-brightness, liquid metal x-ray illumination source. A jet of liquid metal 119 is produced from a liquid metal container 111 and collected in a liquid metal collector 112. A liquid metal circulation system (not shown) returns liquid metal collected by collector 112 to liquid metal container 111. The jet of liquid metal 119 includes one or more elements. By way of non-limiting example, the jet of liquid metal 119 includes any of Aluminum, Gallium, Indium, Tin, Thallium, and Bismuth. In this manner, the jet of liquid metal 119 produces x-ray lines corresponding with its constituent elements. In some embodiments, the x-ray illumination system 110 is configured to generate wavelengths between 0.01 nanometers and 1 nanometer. Exemplary methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

An electron beam source 113 (e.g., electron gun) produces a stream of electrons 118 that is directed by electron optics 114 to the jet of liquid metal 119. Suitable electron optics 114 includes electromagnets, permanent magnets, or a combination of electromagnets and permanent magnets for focusing the electron beam and directing the beam at the liquid metal jet. The coincidence of the jet of liquid metal 119 and the stream of electrons 118 produces an x-ray beam 117 incident on inspection area 102 of specimen 101. X-ray optics 115 shape and direct incident x-ray beam 117 to specimen 101. In some examples, x-ray optics 115 monochromatize the x-ray beam that is incident on the specimen 101. In some examples, x-ray optics 115 collimate or focus the x-ray beam 117 onto inspection area 102 of specimen 101. In some embodiments, x-ray optics 115 includes one or more x-ray collimating mirrors, x-ray apertures, x-ray monochromators, and x-ray beam stops, or any combination thereof.

X-ray detector 116 collects x-ray radiation 125 scattered from specimen 101 and generates an output signal 126 indicative of properties of specimen 101 that are sensitive to the incident x-ray radiation. Scattered x-rays 125 are collected by x-ray detector 116 while specimen positioning system 140 locates and orients specimen 101 to produce angularly resolved scattered x-rays. The x-ray detector 116 is able to resolve one or more x-ray photon energies and produces signals for each x-ray energy component indicative of properties of the specimen. In some embodiments, the x-ray detector 116 includes any of a CCD array, a microchannel plate, a photodiode array, a microstrip proportional counter, a gas filled proportional counter, and a scintillator.

By way of non-limiting example, the small angle x-ray scatterometer illustrated in FIG. 1 is configured as a transmission small angle x-ray scatterometer. However, in some other embodiments combined metrology tool 100 includes a grazing incidence small angle x-ray scatterometer.

Figure 3:
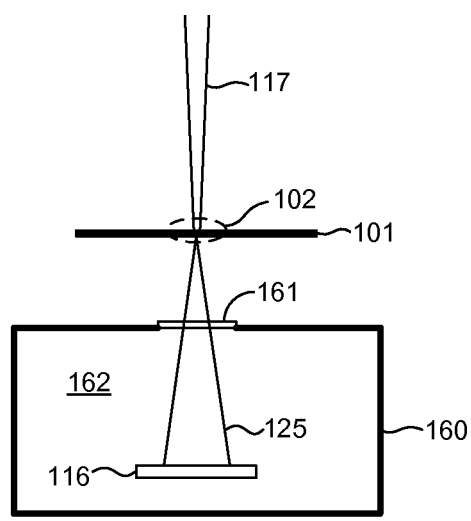
FIG. 3 is a diagram illustrative of a x-ray detector 116 of combined metrology system 100 contained in a vacuum environment 162 separate from specimen 101.

In some embodiments, the x-ray detector is maintained in the same atmospheric environment as specimen 101 (e.g., gas purge environment). However, in some embodiments, the distance between specimen 101 and x-ray detector 116 is lengthy (e.g., greater than one meter). In these embodiments, environmental disturbances (e.g., air turbulence) contribute noise to the detected signals. Hence in some embodiments, the x-ray detector is maintained in a localized, vacuum environment separated from the specimen (e.g., specimen 101) by a vacuum window. FIG. 3 is a diagram illustrative of a vacuum chamber 160 containing x-ray detector 116. In a preferred embodiment, vacuum chamber 160 includes a substantial portion of the path between specimen 101 and x-ray detector 116. An opening of vacuum chamber 160 is covered by vacuum window 161. Vacuum window 161 may be constructed of any suitable material that is substantially transparent to x-ray radiation (e.g., Beryllium). Scattered x-ray radiation 125 passes through vacuum window 161, enters vacuum chamber 160 and is incident on x-ray detector 116. A suitable vacuum environment 162 is maintained within vacuum chamber 160 to minimize disturbances to scattered x-ray radiation 125.

Combined metrology tool 100 also includes an optical illumination system 120 and an optical detector 123. Optical illumination system 120 includes an optical illumination source 121 and optical illumination optics 122 configured to shape and direct incident optical illumination beam 127 from optical illumination source 121 to the inspection area 102 of specimen 101 simultaneous with incident x-ray beam 117. Moreover, the incident optical illumination beam 127 and the incident x-ray illumination beam 117 spatially overlap at the inspection area 102 of the specimen 101.

By way of non-limiting example, optical illumination source 121 includes one or more arc lamps, lasers, light emitting diodes, laser driven plasma sources, and laser driven supercontinuum sources, or any combination thereof. In general, any suitable optical illumination source may be contemplated. In some embodiments, optical illumination source 121 is configured to generate illumination light having wavelength components between 120 nanometers and 2000 nanometers.

Illumination optics 122 is configured to collimate or focus incident optical illumination beam 127 to inspection area 102 of specimen 101. In some examples, illumination optics 122 is configured to monochromatize incident optical illumination beam 127. In some embodiments, illumination optics 122 includes one or more optical mirrors, focusing or defocusing optics, optical waveplates, optical apertures, optical monochromators, and optical beam stops, or any combination thereof.

Optical detector 123 collects optical radiation 128 scattered from specimen 101 and generates an output signal 124 indicative of properties of specimen 101 that are sensitive to the incident optical radiation. Scattered optical radiation 128 is collected by optical detector 123 while specimen positioning system 140 locates and orients specimen 101 to produce angularly resolved scattered optical radiation. The optical detector 123 is able to resolve one or more optical photon energies and produces signals for each optical energy component indicative of properties of the specimen. In some embodiments, the optical detector 123 is any of a CCD array, a photodiode array, a CMOS detector and a photomultiplier tube.

Optical illumination system 120 and optical detector 123 may be configured in any number of known configurations. By way of non-limiting example, optical illumination system 120 and detector 123 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile ellipsometer, any single or multiple wavelength ellipsometer, or any combination thereof.

Combined metrology tool 100 also includes a computing system 130 employed to acquire signals 124 and 126 generated by optical detector 123 and x-ray detector 116, respectively, and determine properties of the specimen based at least in part on the acquired signals. As illustrated in FIG. 1, computing system 130 is communicatively coupled to optical detector 123 and x-ray detector 116. In one aspect, computing system 130 receives measurement data 124 and 126 associated with simultaneous, critical dimension measurements of specimen 101 over an inspection area 102 illuminated by both an x-ray beam 117 and an optical illumination beam 127.

In one example, optical detector 123 is an optical spectrometer and measurement data 124 includes an indication of the measured spectral response of the specimen based on one or more sampling processes implemented by the optical spectrometer. Similarly, in one example, x-ray detector 116 is an x-ray spectrometer and measurement data 126 includes an indication of the measured spectral response of the specimen based on one or more sampling processes implemented by the x-ray spectrometer.

In a further embodiment, computing system 130 is configured to access model parameters in real-time, employing Real Time Critical Dimensioning (RTCD), or it may access libraries of pre-computed models for determining a value of at least one specimen parameter value associated with the specimen 101. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In one further aspect, combined metrology tool 100 includes a computing system (e.g., computing system 130) configured to implement beam control functionality as described herein. In the embodiment depicted in FIG. 1, computing system 130 is configured as a beam controller operable to control the positioning and spot size of the incident x-ray beam 117 and the incident optical illumination beam 127 such that they spatially overlap at the desired inspection area 102 of the specimen 101 at any point in time.

As illustrated in FIG. 1, computing system 130 is communicatively coupled to x-ray detector 116 and optical detector 123. Computing system 130 is configured to receive measurement data 124 from optical detector 123 and measurement data 126 from x-ray detector 116. In one example, measurement data 124 includes an indication of the measured optical response of the specimen. Based on the distribution of the measured optical response on the surface of detector 123, the location and area of incidence of optical illumination beam 127 on specimen 101 is determined by beam controller 130. In one example, pattern recognition techniques are applied by computing system 130 to determine the location and area of incidence of optical illumination beam 127 on specimen 101 based on measurement data 124. Similarly, measurement data 126 includes an indication of the measured x-ray response of the specimen. Based on the distribution of the measured x-ray response on the surface of detector 116, the location and area of incidence x-ray beam 117 on specimen 101 is determined by beam controller 130. In one example, pattern recognition techniques are applied by computing system 130 to determine the location and area of incidence of x-ray beam 117 on specimen 101 based on measurement data 124. In response computing system 130 generates a command signal 137 communicated to illumination optics 122 to redirect and reshape incident optical illumination beam 127 such that incident optical illumination beam 127 spatially overlaps incident x-ray beam 117 at the desired inspection area 102 of specimen 101. Similarly, beam controller 130 generates a command signal 136 communicated to any of electron optics 114 and x-ray optics 115 to redirect and reshape incident x-ray beam 117 such that incident x-ray beam 117 spatially overlaps incident optical illumination beam 127 at the desired inspection area 102 of specimen 101.

In another aspect, simultaneous SAXS and optical scatterometry measurements of a particular inspection area are performed at a number of different out of plane orientations. This increases the precision and accuracy of measured parameters and reduces correlations among parameters by extending the number and diversity of data sets available for analysis to include a variety of large-angle, out of plane orientations. Measuring specimen parameters with a deeper, more diverse data set also reduces correlations among parameters and improves measurement accuracy.

As illustrated in FIG. 1, combined metrology tool 100 includes a specimen positioning system 140 configured to both align specimen 101 and orient specimen 101 over a large range of out of plane angular orientations with respect the optical scatterometer and the small angle x-ray scatterometer. In other words, specimen positioning system 140 is configured to rotate specimen 101 over a large angular range about one or more axes of rotation aligned in-plane with the surface of specimen 101. In some embodiments, specimen positioning system 140 is configured to rotate specimen 101 within a range of at least 90 degrees about one or more axes of rotation aligned in-plane with the surface of specimen 101. In some embodiments, specimen positioning system is configured to rotate specimen 101 within a range of at least 60 degrees about one or more axes of rotation aligned in-plane with the surface of specimen 101. In some other embodiments, specimen positioning system is configured to rotate specimen 101 within a range of at least one degree about one or more axes of rotation aligned in-plane with the surface of specimen 101. In this manner, angle resolved measurements of specimen 101 are collected by metrology system 100 over any number of locations on the surface of specimen 101. In one example, computing system 130 communicates command signals to motion controller 145 of specimen positioning system 140 that indicate the desired position of specimen 101. In response, motion controller 145 generates command signals to the various actuators of specimen positioning system 140 to achieve the desired positioning of specimen 101.

By way of non-limiting example, as illustrated in FIG. 1, specimen positioning system 140 includes an edge grip chuck 141 to fixedly attach specimen 101 to specimen positioning system 140. A rotational actuator 142 is configured to rotate edge grip chuck 141 and the attached specimen 101 with respect to a perimeter frame 143. In the depicted embodiment, rotational actuator 142 is configured to rotate specimen 101 about the x-axis of the coordinate system 146 illustrated in FIG. 1. As depicted in FIG. 1, a rotation of specimen 101 about the z-axis is an in plane rotation of specimen 101. Rotations about the x-axis and the y-axis (not shown) are out of plane rotations of specimen 101 that effectively tilt the surface of the specimen with respect to the metrology elements of metrology system 100. Although it is not illustrated, a second rotational actuator is configured to rotate specimen 101 about the y-axis. A linear actuator 144 is configured to translate perimeter frame 143 in the x-direction. Another linear actuator (not shown) is configured to translate perimeter frame 143 in the y-direction. In this manner, every location on the surface of specimen 101 is available for measurement over a range of out of plane angular positions. For example, in one embodiment, a location of specimen 101 is measured over several angular increments within a range of −45 degrees to +45 degrees with respect to the normal orientation of specimen 101.

Typical optical scatterometry systems do not employ a specimen positioning system capable of orienting a specimen over a large range of out of plane angular positions (e.g., greater than +/− one degree). As a result, measurement information collected by these systems often lacks sensitivity to certain parameters or is unable to reduce correlations between parameters. However, the large, out of plane, angular positioning capability of specimen positioning system 140 expands measurement sensitivity and reduces correlations between parameters. For example, in a normal orientation, SAXS is able to resolve the critical dimension of a feature, but is largely insensitive to sidewall angle and height of a feature. However, by collecting measurement data over a broad range of out of plane angular positions, the sidewall angle and height of a feature can be resolved.

In yet another aspect, the precision and accuracy of parameters measured with combined SAXS and optical scatterometry techniques can be improved by identifying shared model parameters that are mathematically resolved using data sets derived from SAXS and optical scatterometry measurements either sequentially or in parallel. Measuring shared parameters with a diversity of measurement technologies reduces correlations among parameters and improves measurement accuracy.

In general, SAXS and the optical scatterometry techniques discussed herein are indirect methods of measuring some physical properties of the specimen under inspection. In most cases, the measured values cannot be used to directly determine the physical properties of the specimen. The nominal measurement process consists of parameterization of the structure (e.g., film thicknesses, critical dimensions, etc.) and the machine (e.g., wavelengths, angles of incidence, polarization angles, etc.). A model is created that attempts to predict the measured values. The model includes parameters associated with the machine ($P_{machine}$) and the specimen ($P_{specimen}$).

Machine parameters are parameters used to characterize the metrology tool itself. Exemplary machine parameters include angle of incidence (AOI), analyzer angle ($A_0$), polarizer angle ($P_0$), illumination wavelength, numerical aperture (NA), etc. Specimen parameters are parameters used to characterize the specimen. For a thin film specimen, exemplary specimen parameters include refractive index, dielectric function tensor, nominal layer thickness of all layers, layer sequence, etc. For measurement purposes, the machine parameters are treated as known, fixed parameters and the specimen parameters are treated as unknown, floating parameters. The floating parameters are resolved by a fitting process (e.g., regression, library matching, etc.) that produces the best fit between theoretical predictions and experimental data. The unknown specimen parameters, $P_{specimen}$, are varied and the model output values are calculated until a set of specimen parameter values are determined that results in a close match between the model output values and the experimentally measured values.

In another further aspect, combined metrology tool 100 includes a computing system configured to generate a geometric model of a measured structure of a specimen, generate an optical response model and a x-ray response model that each include at least one shared geometric parameter from the geometric model, and resolve at least one specimen parameter value by performing a fitting analysis of x-ray measurement data with the x-ray response model and a fitting analysis on optical measurement data with the optical response model. In the embodiment depicted in FIG. 1, computing system 130 is configured as a model building and analysis engine configured to implement model building and analysis functionality as described herein.

Figure 2:
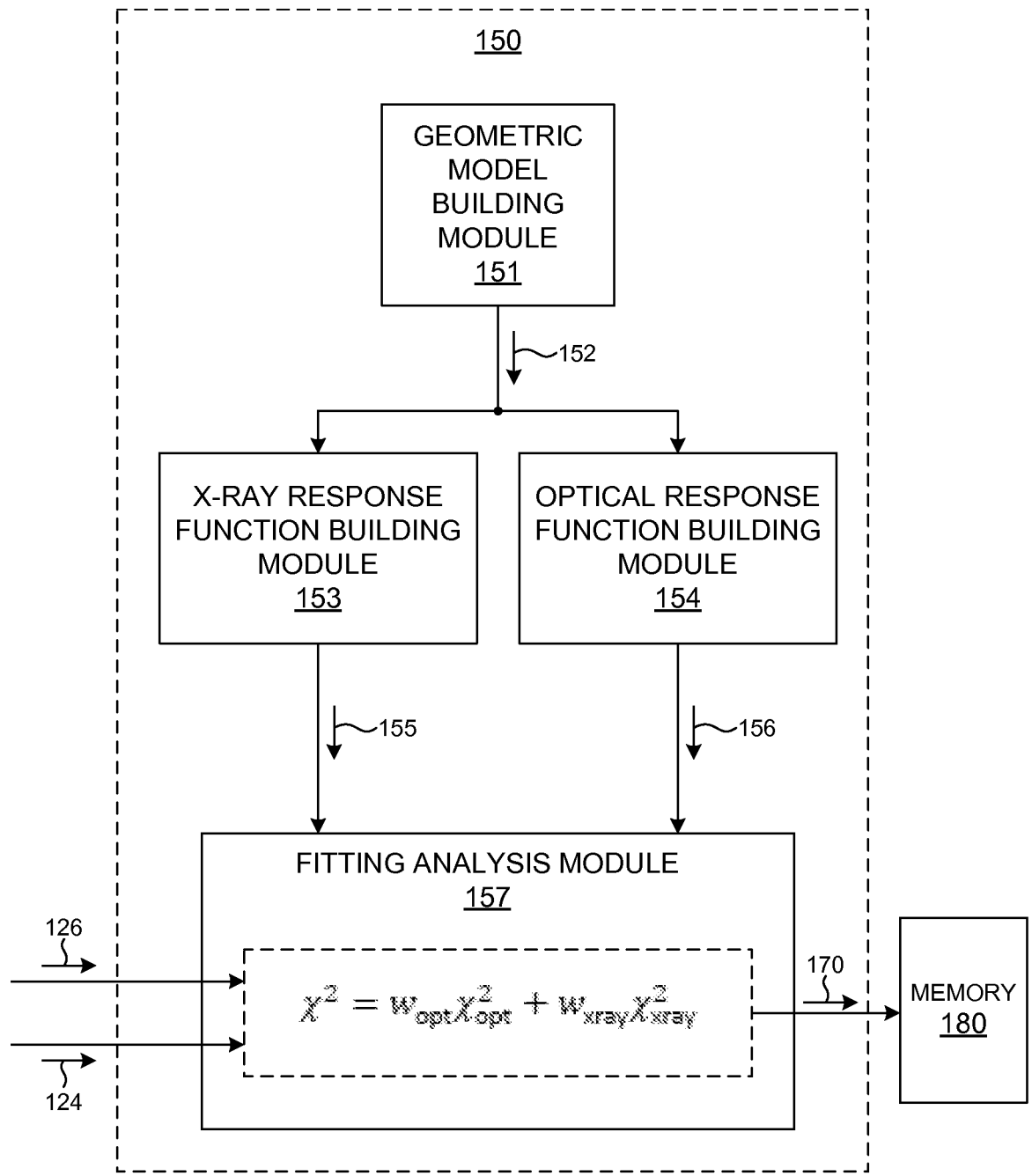
FIG. 2 is a diagram illustrative of a model building and analysis engine 150 configured to resolve specimen parameter values based on x-ray and optical metrology data in accordance with the methods described herein.

FIG. 2 is a diagram illustrative of an exemplary model building and analysis engine 150 implemented by computing system 130. As depicted in FIG. 2, model building and analysis engine 150 includes a geometric model building module 151 that generates a geometric model 152 of a measured structure of a specimen. In some embodiments, geometric model 152 also includes material properties of the specimen. The geometric model 152 is received as input to x-ray response function building module 153 and optical response function building module 154. X-ray response function building module 153 generates a x-ray response function model 155 based at least in part on the geometric model 152. In some examples, the x-ray response function model 155 is based on x-ray form factors $$F(\vec{q}) = \int \rho(\vec{r}) e^{-i\vec{q}\cdot\vec{r}} d\vec{r} \qquad (1)$$

where F is the form factor, q is the scattering vector, and ρ(r) is the electron density of the specimen in spherical coordinates. The x-ray scattering intensity is then given by $$I(\vec{q}) = F^*F. \qquad (2)$$

Similarly, optical response function building module 154 generates an optical response function model 156 based at least in part on the geometric model 152. In some examples, optical response function model 156 is based on rigorous coupled-wave analysis (RCWA) where Maxwell's equations are solved to predict the optical scattering from the specimen model.

X-ray response function model 155 and optical response function model 156 are received as input to fitting analysis module 157. The fitting analysis module 157 compares the modeled x-ray and optical scattering with the corresponding measured data to determine geometric as well as material properties of the specimen.

In some examples, the fitting of modeled data to experimental data is achieved by minimizing a chi-squared value. For example, for optical metrology, a chi-squared value can be defined as $$\chi^2_{opt} = \frac{1}{N_{opt}} \sum_{i}^{N_{opt}} \frac{\left(S_i^{opt.\ model}(u_1, \ldots, u_M) - S_i^{opt.\ experiment}\right)^2}{\sigma^2_{opt,i}} \qquad (3)$$

where $S_i^{opt.\ experiment}$ is the measured optical signals 124 measured experimentally in the "channel" i, where the index describes a set of system parameters such as wavelength, angular coordinate, polarization, etc. $S_i^{opt.\ model}(u_1, \ldots, u_M)$ is the modeled optical signal for the "channel" i, evaluated for a set of structure (target) parameters $u_1, \ldots, u_M$, where these parameters describe geometric (film thicknesses, CD, sidewall angle, overlay, etc.) and material (refractive indices, absorption coefficients, dispersion model parameters), etc. $\sigma_{opt,i}$ is the uncertainty associated with "channel" i. $N_{opt}$ is the total number of channels in the optical metrology. M is the number of parameters characterizing the metrology target. Exemplary methods and systems for model based analysis of optical spectroscopic measurement data is described in U.S. Pat. No. 7,478,019, issued on Jan. 13, 2009, to KLA-Tencor Corp., the entirety of which is incorporated herein by reference.

Similarly, for x-ray measurements (e.g. for CD-SAXS), a chi-squared value can be defined as $$\chi^2_{xray} = \frac{1}{N_{xray}} \sum_{j}^{N_{xray}} \frac{\left(S_j^{xray\ model}(v_1, \ldots, v_L) - S_j^{xray\ experiment}\right)^2}{\sigma^2_{xray,j}} \qquad (4)$$

Where, $S_j^{xray\ experiment}$ is the measured x-ray signals 126 in the "channel" j, where the index j describes a set of system parameters such as energy, angular coordinate, etc. $S_j^{xray\ model}(v_1, \ldots, v_L)$ is the modeled x-ray signal $S_j$ for the "channel" j, evaluated for a set of structure (target) parameters $v_1, \ldots, v_L$, where these parameters describe geometric (film thicknesses, CD, sidewall angle, overlay, etc.) and material (electron density, etc.). $\sigma_{xray,j}$ is the uncertainty associated with the jth channel. $N_{xray}$ is the total number of channels in the x-ray metrology. L is the number of parameters characterizing the metrology target.

Equations (3) and (4) assume that the uncertainties associated with different channels are uncorrelated. In examples where the uncertainties associated with the different channels are correlated, a covariance between the uncertainties, can be calculated. In these examples a chi-squared value for optical measurements can be expressed as $$\chi^2_{opt} = \frac{1}{N_{opt}} \left(\vec{S}_i^{opt.\ model}(u_1, \ldots, u_M) - \vec{S}_i^{opt.\ experiment}\right)^T$$
$$V_{opt}^{-1} \left(\vec{S}_i^{opt.\ model}(u_1, \ldots, u_M) - Siopt.\right)$$

experiment where, $V_{opt}^{(5)}$ is the covariance matrix of the optical channel uncertainties, and T denotes the transpose. A chi-squared value for x-ray measurements can be calculated in the same manner.

The set of target parameters for the optical model (i.e., $\{u_1, \ldots, u_M\}$) and the x-ray model (i.e., $\{v_1, \ldots, v_L\}$) are not the same in general. The reason is that the difference in material constants and functions needed to describe optical and x-ray interaction processes give rise to different target parameters. However, at least one geometric parameter is common between the x-ray response function model 155 and the optical response function model 156. The common parameter is either identical or related to each other by an unambiguous algebraic transformation. In some examples, target parameters such as film thicknesses, CD, overlay, etc. are common between both the x-ray response function model 155 and the optical response function model 156.

In some examples, fitting analysis module 157 resolves at least one specimen parameter value by sequentially performing a fitting analysis on x-ray measurement data 126 with the x-ray response model 155 and a fitting analysis on optical measurement data 124 with the optical response model 156. In some examples, $\chi_{opt}^2$ is optimized first, and any resolved, common specimen parameter values are treated as constants in the subsequent optimization of $\chi_{xray}^2$. Similarly, in some other examples, $\chi_{xray}^2$ is optimized first, and any resolved, common specimen parameter values are treated as constants in the subsequent optimization of $\chi_{opt}^2$.

In some other examples, fitting analysis module 157 resolves at least one specimen parameter value by performing a parallel fitting analysis on x-ray measurement data 126 with the x-ray response model 155 and on optical measurement data 124 with the optical response model 156. For example, a chi-squared function suitable for parallel analysis can be defined as $$\chi^2 = w_{opt}\chi_{opt}^2 + w_{xray}\chi_{xray}^2 \quad (6)$$

where $w_{opt}$ and $w_{xray}$ are weighting coefficients that are assigned to the optical and x-ray metrologies. In the simplest case, $w_{opt} = w_{xray} = 1$. However, assigning different weights often enhances the more relevant metrology. The selection of proper weights is usually done by analysis of experimental data versus reference metrology and/or measuring pre-programmed design of experiments (DOE) parameter variations on special DOE targets.

Optical and x-ray metrologies may contain more than one respective technology when calculating chi-squared values. For example, $\chi_{xray}^2$ may be calculated for the combined use of grazing incidence SAXS and transmission SAXS with a weight coefficient given to each technology. Likewise, $\chi_{opt}^2$ may be calculated for the combined use of spectroscopic ellipsometry, beam profile reflectometry and spectroscopic reflectometry with a weight coefficient assigned to each technology.

As described hereinbefore, the fitting of x-ray and optical data is achieved the minimization of chi-squared values. However, in general, the fitting of x-ray and optical data may be achieved by other functions.

The combined fitting of optical metrology data and x-ray metrology data is advantageous for any type of x-ray and optical technology that provides complementary sensitivity to geometric and/or material parameters of interest. This is specifically the case where at least one geometric parameter is common between the x-ray and the optical models. Specimen parameters can be deterministic (e.g., film thicknesses, CD, SWA, etc.) or statistical (e.g., rms height of sidewall roughness, roughness correlation length, etc.) as long as proper models describing x-ray and optical beam interaction with the specimen are used.

Model building and analysis engine 150 improves the accuracy of measured parameters by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

It should be recognized that the various steps described throughout the present disclosure may be carried out by a single computer system 130 or, alternatively, a multiple computer system 130. Moreover, different subsystems of the system 100, such as the specimen positioning system 140, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the optical detector 123, the x-ray detector 116, the optical illumination optics 122, and the x-ray illumination optics 115 in any manner known in the art. For example, the one or more computing systems 130 may be coupled to computing systems associated with the optical detector 123, the x-ray detector 116, the optical illumination optics 122, and the x-ray illumination optics 115, respectively. In another example, any of the optical detector 123, the x-ray detector 116, the optical illumination optics 122, and the x-ray illumination optics 115 may be controlled directly by a single computer system coupled to computer system 130.

The computer system 130 of the combined metrology system 100 may be configured to receive and/or acquire data or information from the subsystems of the system (e.g., optical detector 123, the x-ray detector 116, the optical illumination optics 122, and the x-ray illumination optics 115, and the like) by a transmission medium that may include wireline and/or wireless portions. In this manner, the transmission medium may serve as a data link between the computer system 130 and other subsystems of the system 100.

Computer system 130 of the combined metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, or external systems). For example, the computing system 130 may be configured to receive measurement data (e.g., signals 124 and 126) from a storage medium (i.e., memory 132 or memory 180) via a data link. For instance, spectral results obtained using a spectrometer of any of x-ray detector 116 and optical detector 123 may be stored in a permanent or semi-permanent memory device (e.g., memory 132 or 180). In this regard, the spectral results may be imported from on-board memory or from an external memory system. Moreover, the computer system 116 may send data to other systems via a transmission medium. For instance, specimen parameter values 170 determined by computer system 130 may be stored in a permanent or semi-permanent memory device (e.g., memory 180). In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

In some embodiments, a combined x-ray and optical analysis as described herein is implemented as part of a fabrication process tool. Examples of fabrication process tools include, but are not limited to, lithographic exposure tools, film deposition tools, implant tools, and etch tools. In this manner, the results of a combined x-ray and optical analysis are used to control a fabrication process. In one example, x-ray and optical measurement data collected from one or more targets is sent to a fabrication process tool. The x-ray and optical measurement data is analyzed as described herein and the results used to adjust the operation of the fabrication process tool.

Figure 4:
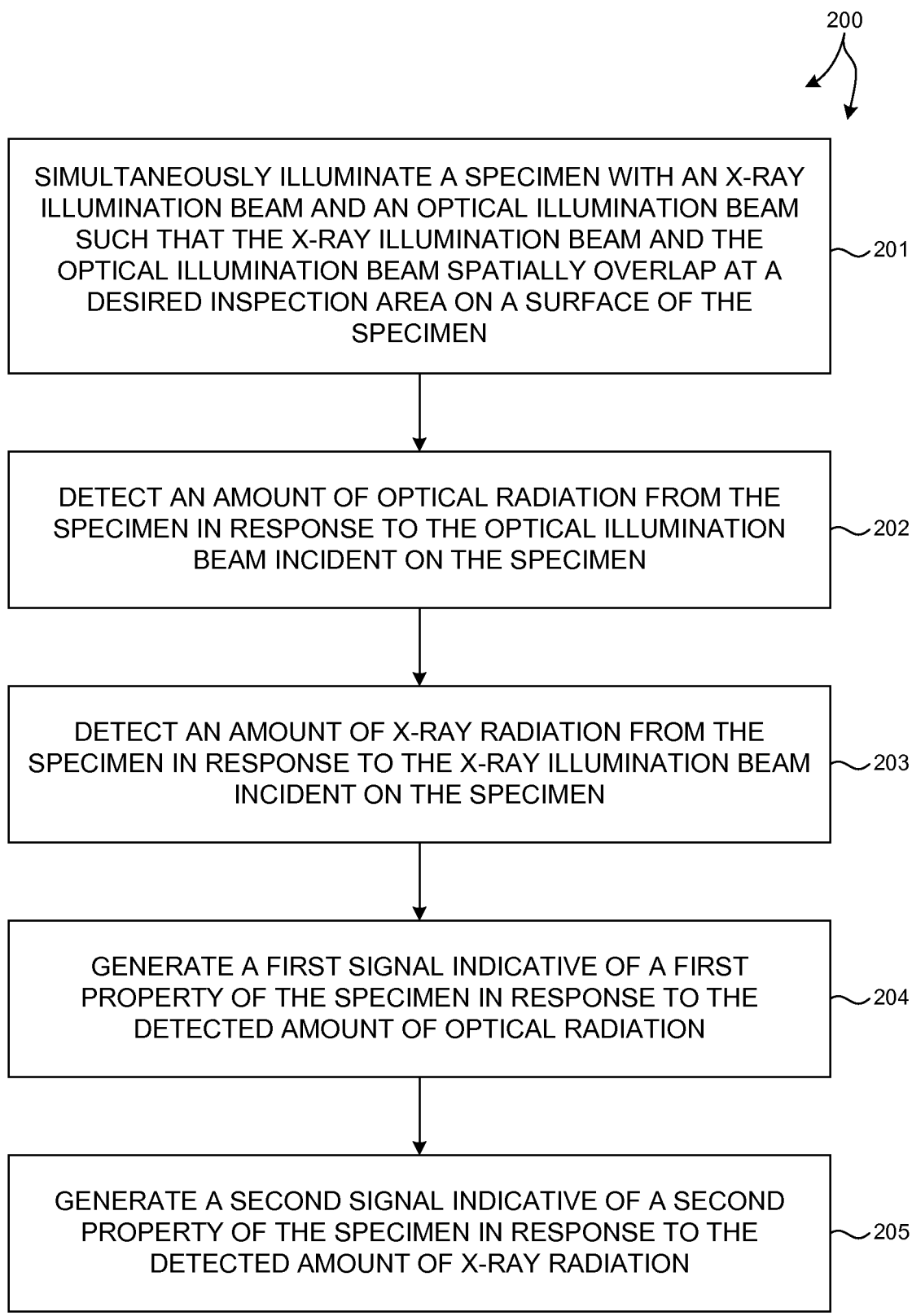
FIG. 4 is a flowchart illustrative of an exemplary method 200 of performing simultaneous optical scattering and small angle x-ray scattering (SAXS) measurements over an inspection area of a specimen.

FIG. 4 illustrates a method 200 suitable for implementation by the combined metrology system 100 of the present invention. In one aspect, it is recognized that data processing blocks of method 200 may be carried out via a pre-programmed algorithm executed by one or more processors of computing system 130. While the following description is presented in the context of combined metrology system 100, it is recognized herein that the particular structural aspects of combined metrology system 100 do not represent limitations and should be interpreted as illustrative only.

In block 201, a specimen is simultaneously illuminated by an x-ray illumination beam and an optical illumination beam such that the x-ray illumination beam and the optical illumination beam spatially overlap at a desired inspection area on a surface of the specimen.

In block 202, an amount of optical radiation from the specimen is detected in response to the optical illumination beam incident on the specimen.

In block 203, an amount of x-ray radiation from the specimen is detected in response to the x-ray illumination beam incident on the specimen.

In block 204, a first output signal is generated that is indicative of a property of the specimen. The first output signal is generated in response to amount of detected optical radiation.

In block 205, a second output signal is generated that is indicative of the same property of the specimen as in block 204 or a different property of the specimen as in block 204. The output signal is generated in response to amount of detected x-ray radiation.

Figure 5:
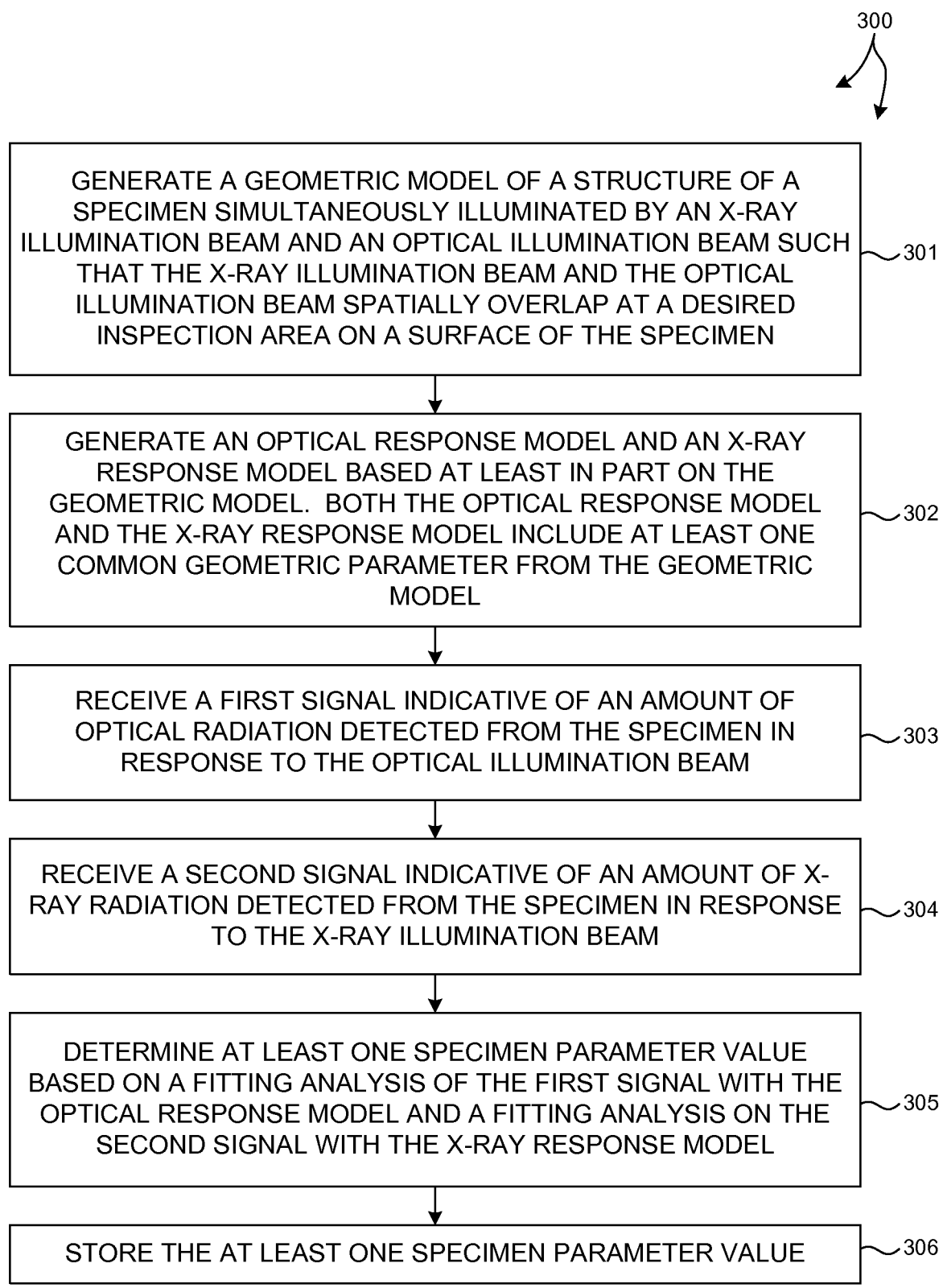
FIG. 5 is a flowchart illustrative of an exemplary method 300 of determining specimen parameter values based on a fitting analysis that includes x-ray response models and optical response models that share at least one common geometric parameter.

FIG. 5 illustrates a method 300 suitable for implementation by the combined metrology system 100 of the present invention. In one aspect, it is recognized that data processing blocks of method 300 may be carried out via a pre-programmed algorithm executed by one or more processors of computing system 130. While the following description is presented in the context of combined metrology system 100, it is recognized herein that the particular structural aspects of combined metrology system 100 do not represent limitations and should be interpreted as illustrative only.

In block 301, a geometric model of a structure of a specimen is generated. The structure is simultaneously illuminated by an x-ray illumination beam and an optical illumination beam such that the x-ray illumination beam and the optical illumination beam spatially overlap at a desired inspection area on a surface of the specimen.

In block 302, an optical response model and an x-ray response model are generated based at least in part on the geometric model. Both the optical response model and the x-ray response model include at least one common geometric parameter from the geometric model.

In block 303, a first signal indicative of an amount of optical radiation detected from the specimen in response to the optical illumination beam is received.

In block 304, a second signal indicative of an amount of x-ray radiation detected from the specimen in response to the x-ray illumination beam is received.

In block 305, at least one specimen parameter value is determined based on a fitting analysis of the first signal with the optical response model and a fitting analysis on the second signal with the x-ray response model.

In block 306, the specimen parameter value is stored in a memory (e.g., memory 132).

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology tool comprising:
a liquid metal based x-ray illumination system including a liquid metal x-ray illumination source and x-ray illumination optics configured to shape and direct an incident x-ray beam from the x-ray illumination source to an inspection area of a specimen;
an x-ray detector configured to receive radiation from the specimen in response to the incident x-ray beam and generate signals indicative of a first property of the specimen;
an optical illumination system including an optical illumination source and optical illumination optics configured to shape and direct an incident optical illumination beam from the optical illumination source to the inspection area of the specimen simultaneous with the incident x-ray beam, wherein the incident optical illumination beam and the incident x-ray beam spatially overlap at the inspection area of the specimen; and
an optical detector configured to receive optical radiation from the specimen in response to the incident optical illumination beam and generate signals indicative of a second property of the specimen simultaneous with the x-ray detector receiving the radiation from the specimen in response to the incident x-ray beam and generating signals indicative of the first property of the specimen.

2. The metrology tool of claim 1, further comprising:
a beam controller operable to communicate either a first command signal to the x-ray illumination optics system to redirect the incident x-ray beam such that the incident optical illumination beam and the incident x-ray beam spatially overlap at the inspection area of the specimen or a second command signal to the optical illumination optics system to redirect the incident optical illumination beam such that the incident optical illumination beam and the incident x-ray beam spatially overlap at the inspection area of the specimen, wherein the first command signal and the second command signal are determined based at least in part on the radiation received from the specimen in response to the incident x-ray beam and the radiation received from the specimen in response to the incident optical illumination beam, respectively.

3. The metrology tool of claim 1, further comprising:
a wafer positioning system configured to selectively position the specimen at a plurality of different orientations out of plane from a planar surface of the specimen for the simultaneous illumination of the inspection area by both the incident x-ray beam and the incident optical illumination beam.

4. The metrology tool of claim 1, wherein the wafer positioning system is configured to selectively position the specimen within a range of at least one degree about one or more axes of rotation aligned in-plane with the surface of the specimen.

5. The metrology tool of claim 1, further comprising:
a model building and analysis engine configured to:
generate a geometric model of a structure of the specimen;
generate an optical response model and an x-ray response model based at least in part on the geometric model, wherein both the optical response model and the x-ray response model include at least one common geometric parameter from the geometric model;
receive the signals generated by the x-ray detector to obtain a x-ray measurement data set;
receive the signals generated by the optical detector to obtain an optical measurement data set; and
determine at least one specimen parameter value based on a fitting analysis on the x-ray measurement data set with the x-ray response model and a fitting analysis of the optical measurement data set with the optical response model; and
store the at least one specimen parameter value.

6. The metrology tool of claim 5, wherein a value of the at least one common geometric parameter is determined based on the fitting analysis on the x-ray measurement data set and the determined value is treated as a constant in the fitting analysis of the optical measurement data set.

7. The metrology tool of claim 5, wherein the at least one common geometric parameter is treated as a global parameter in a parallel fitting analysis including both the fitting analysis on the x-ray measurement data set and the fitting analysis of the optical measurement data set.

8. The metrology tool of claim 1, wherein the liquid metal based x-ray illumination system, the x-ray illumination optics system, and the x-ray detector are configured as any of a transmission small angle x-ray scattering system and a grazing incidence small angle x-ray scattering system.

9. The metrology tool of claim 1, wherein the x-ray detector is located within a localized vacuum environment separated from the specimen by a vacuum window.

10. The metrology tool of claim 1, wherein the first property and the second property of the specimen are the same property.

11. The metrology tool of claim 1, wherein the liquid metal x-ray illumination source comprises,
a liquid metal source for heating and melting at least one metal and producing a liquid metal jet,
a liquid metal collector for acquiring the liquid metal jet,
a liquid metal circulation system for returning liquid metal from the liquid metal collector to the liquid metal source, and
an electron beam source for directing an electron beam at the liquid metal jet, thereby producing the incident x-ray beam that is directable toward the inspection area.

12. A method comprising:
simultaneously illuminating a specimen with an x-ray illumination beam and an optical illumination beam such that the x-ray illumination beam and the optical illumination beam spatially overlap at a desired inspection area on a surface of the specimen;
simultaneously detecting an amount of optical radiation from the specimen in response to the optical illumination beam incident on the specimen and detecting an amount of x-ray radiation from the specimen in response to the x-ray illumination beam incident on the specimen;
generating a first signal indicative of a first property of the specimen in response to the detected amount of optical radiation; and
generating a second signal indicative of a second property of the specimen in response to the detected amount of x-ray radiation.

13. The method of claim 12, further comprising:
redirecting the optical illumination beam based on the first signal such that the optical illumination beam is incident on the surface of the specimen at the desired inspection area; or
redirecting the x-ray illumination beam based on the second signal such that the x-ray illumination beam is incident on the surface of the specimen at the desired inspection area.

14. The method of claim 12, further comprising:
rotating the specimen to a plurality of different orientations out of plane from the surface of the specimen.

15. The method of claim 12, further comprising:
generating a geometric model of a structure of the specimen;
generating an optical response model and an x-ray response model based at least in part on the geometric model, wherein both the optical response model and the x-ray response model include at least one common geometric parameter from the geometric model;
receiving the first and second signals;
determining at least one specimen parameter value based on a fitting analysis of the first signal with the optical response model and a fitting analysis on the second signal with the x-ray response model; and
storing the at least one specimen parameter value.

16. The method of claim 15, further comprising:
determining a value of the at least one common geometric parameter based on the fitting analysis on the second signal, wherein the determined value of the at least one common geometric parameter is treated as a constant in the fitting analysis on the first signal.

17. The method of claim 15, further comprising:
determining a value of the at least one common geometric parameter based on a parallel fitting analysis on the first signal with the optical response model and on the second signal with the x-ray response model.

18. A non-transitory, computer-readable medium, comprising:
code for causing a computer to generate a geometric model of a structure of a specimen simultaneously illuminated by an x-ray illumination beam and an optical illumination beam such that the x-ray illumination beam and the optical illumination beam spatially overlap at a desired inspection area on a surface of the specimen;
code for causing the computer to generate an optical response model and an x-ray response model based at least in part on the geometric model, wherein both the optical response model and the x-ray response model include at least one common geometric parameter from the geometric model;
code for causing the computer to receive a first signal indicative of an amount of optical radiation detected from the specimen in response to the optical illumination beam;
code for causing the computer to receive a second signal indicative of an amount of x-ray radiation detected from the specimen in response to the x-ray illumination beam;
code for causing the computer to determine at least one specimen parameter value based on a fitting analysis of the first signal with the optical response model and a fitting analysis on the second signal with the x-ray response model; and code for causing the computer to store the at least one specimen parameter value.

19. The non-transitory, computer-readable medium of claim 18, further comprising:

code for causing the computer to determine a value of the at least one common geometric parameter based on the fitting analysis on the second signal, wherein the determined value of the at least one common geometric parameter is treated as a constant in the fitting analysis on the first signal.

20. The non-transitory, computer-readable medium of claim 18, further comprising:

code for causing the computer to determine a value of the at least one common geometric parameter based on a parallel fitting analysis on the first signal with the optical response model and on the second signal with the x-ray response model.

* * * * *